(12) United States Patent
Wang (10) Patent No.: US 8,985,197 B2
(45) Date of Patent: Mar. 24, 2015

(54) HEAT DISSIPATION UNIT WITH MOUNTING STRUCTURE

(75) Inventor: Jui-Pin Wang, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 368 days.

(21) Appl. No.: 13/226,473

(22) Filed: Sep. 6, 2011

(65) Prior Publication Data

US 2013/0043000 A1 Feb. 21, 2013

(30) Foreign Application Priority Data

Aug. 17, 2011 (TW) .................................. 100129398

(51) Int. Cl.
| | | |
|---|---|---|
| F28D 15/00 | (2006.01) | |
| F28F 3/12 | (2006.01) | |
| H01L 23/40 | (2006.01) | |
| H01L 23/427 | (2006.01) | |
| F28D 15/02 | (2006.01) | |
| H05K 7/20 | (2006.01) | |

(52) U.S. Cl.
CPC .............. *F28F 3/12* (2013.01); *H01L 23/4006* (2013.01); *H01L 23/427* (2013.01); *F28D 15/0233* (2013.01); *F28F 2280/00* (2013.01)
USPC .................. 165/104.26; 165/170; 165/104.21

(58) Field of Classification Search
CPC .. F28F 2280/00; F28F 2280/02; F28D 15/02; F28D 15/04; F28D 15/0275; F28D 15/0233; H01L 23/4006; H01L 23/427
USPC ................ 165/104.26, 104.21, 80.2, 76, 170, 165/80.3, 79; 361/700, 718–719; 257/715, 257/719
See application file for complete search history.

(56) References Cited

U.S. PATENT DOCUMENTS

| | | | | |
|---|---|---|---|---|
| 4,461,343 | A * | 7/1984 | Token et al. ............. | 165/104.26 |
| 6,535,386 | B2 * | 3/2003 | Sathe et al. .................... | 361/700 |
| 6,650,544 | B1 * | 11/2003 | Lai ................................ | 361/700 |
| 6,802,363 | B1 * | 10/2004 | Wang ....................... | 165/104.26 |
| 6,874,568 | B2 * | 4/2005 | Lai ........................... | 165/104.26 |
| 6,896,039 | B2 * | 5/2005 | Dussinger et al. ........ | 165/104.26 |
| 7,540,318 | B2 * | 6/2009 | Nitta et al. ................ | 165/104.26 |
| 2003/0155105 | A1 * | 8/2003 | Garner ...................... | 165/104.26 |
| 2003/0159806 | A1 * | 8/2003 | Sehmbey et al. ............. | 165/80.3 |

* cited by examiner

*Primary Examiner* — Tho V Duong
(74) *Attorney, Agent, or Firm* — C. G. Mersereau; Nikolai & Mersereau, P.A.

(57) ABSTRACT

A heat dissipation unit with mounting structure includes a main body and a plurality of mounting elements. The main body internally defines a chamber, and includes a plurality of supports located in the chamber, a working fluid filled in the chamber, and at least one wick structure formed on inner wall surfaces of the chamber. The mounting elements are externally connected to one side of the main body at positions corresponding to the supports in the chamber, and respectively define an internally threaded coupling bore therein. With these arrangements, it is able to ensure the air-tightness of the chamber of the heat dissipation unit having the mounting elements provided thereon. Further, the mounting elements with internally threaded coupling bore also provide good locking effect for the heat dissipation unit to securely connect with other elements via the mounting elements.

9 Claims, 8 Drawing Sheets line A-A of Fig. 1A

Fig. 1A line A-A of Fig.1A

Fig. 6B line B-B of Fig. 6A

HEAT DISSIPATION UNIT WITH MOUNTING STRUCTURE

This application claims the priority benefit of Taiwan patent application number 100129398 filed on Aug. 17, 2011.

FIELD OF THE INVENTION

The present invention relates to a heat dissipation unit, and more particularly to a heat dissipation unit, to which mounting elements with good locking effect are externally connected without causing damage to a main body of the heat dissipation unit or leakage of a chamber in the main body, so that good heat transfer efficiency of the heat dissipation device can be ensured.

BACKGROUND OF THE INVENTION

In response to the consumers' demands for compact electronic devices, all the electronic elements for the electronic devices must also be reduced in size. However, heat generated by the size-reduced electronic elements forms a main hindrance to the good performance of the compact electronic devices. Nevertheless, consumers still demand for enhanced performance of the electronic devices even if the semiconductors forming the electronic elements are constantly reduced in size.

A size-reduced semiconductor element would have increased heat flux. With the increased heat flux, it becomes more difficult to overcome the problem of cooling an electronic device. The increase of heat flux would cause overheat of the electronic device at different time and over different length or size of the device, and might cause damage to or even burnout of the whole electronic device.

A vapor chamber is applied to transfer heat between two relatively large faces, and is therefore different from a heat pipe that transfers heat between two points. And, the vapor chamber can be advantageously used in a relatively narrow space.

The vapor chamber has a heat absorption face and an opposite condensing face, and internally defines a vacuum space having a working fluid filled therein. The vacuum space is internally provided with a plurality of supports and a wick structure. The supports are respectively connected at two ends to the heat absorption face and condensing face for supporting the vacuum space. The heat absorption face of the vapor chamber is in contact with a heat source while the condensing face is connected to another heat dissipation device, so that heat absorbed by the working fluid is further transferred to the another dissipation device and dissipates into external environment therefrom. The working fluid absorbs heat from the heat absorption face and is therefore vaporized. The vapor-phase working fluid flows in the vacuum space to the condensing face and condenses into liquid again when contacting with the condensing face. The liquid-phase working fluid flows back toward the heat absorption face due to a capillary effect of the wick structure in the vacuum space to thereby complete one cycle of liquid-vapor circulation in the vapor chamber to transfer heat.

The conventional vapor chamber is used with a circuit board, so that heat generated by heat-generating elements on the circuit board is transferred to the vapor chamber and is finally dissipated into ambient air from the condensing face of the vapor chamber. To connect the vapor chamber to the circuit board, an internally threaded hollow copper post is extended through each of four corners of the vapor chamber without interfering with the vacuum space, and holes are formed on the circuit board at a positions corresponding to the copper posts, so that fastening elements can be screwed through the copper posts and the holes to lock the vapor chamber to the circuit board. To avoid interfering with the vacuum space, the copper posts are provided at four corners of the vapor chamber to locate relatively distant from the heat-generating elements. As a result, the heat absorption face of the vapor chamber is not in tight contact with the heat source and there is a thermal resistance between the vapor chamber and the heat-generating elements. To overcome the above problems, there are manufacturers who try to provide the copper posts on the vapor chamber at positions near the heat-generating elements. That is, the copper posts are directly extended through the vacuum space of the vapor chamber. In this manner, the vapor chamber can be in tight contact with the heat source to prevent the thermal resistance. However, the vacuum space being extended through by the copper posts loses its vacuum tightness and is no longer in a vacuum state. Further, the copper posts extended through the vacuum space would inevitably form an impediment in the flow path of the working fluid filled in the vacuum space to thereby cause reduction in the heat transfer efficiency of the vapor chamber. In some worse conditions, the working fluid might leak out of the vacuum space to result in a useless vapor chamber. In brief, the vapor chamber with the conventional mounting structure is subjected to the following problems: (1) there would be a thermal resistance between the vapor chamber and the heat source; and (2) the vapor chamber might have reduced heat transfer efficiency.

SUMMARY OF THE INVENTION

A primary object of the present invention is to provide a heat dissipation unit with mounting structure, so that the mounting structure not only provides good locking effect for the heat dissipation unit to securely connect with other elements via the mounting structure, but also ensures the air-tightness of a chamber in a main body of the heat dissipation unit for the same to maintain good heat transfer efficiency.

To achieve the above and other objects, the heat dissipation unit with mounting structure according to the present invention includes a main body and a plurality of mounting elements. The main body internally defines a chamber, and includes a plurality of supports located in the chamber, a working fluid filled in the chamber, and at least one wick structure formed on inner wall surfaces of the chamber. The mounting elements are externally connected to one side of the main body at positions corresponding to the supports in the chamber, and respectively define an internally threaded coupling bore therein. With the mounting elements being externally connected to the main body to form an integral part thereof, it is able to ensure the air-tightness of the chamber in the main body of the heat dissipation unit. Further, the mounting elements with internally threaded coupling bore also provide good locking effect for the heat dissipation unit to securely connect with other elements.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The present invention will now be described with some preferred embodiments thereof and with reference to the accompanying drawings. For the purpose of easy to understand, elements that are the same in the preferred embodiments are denoted by the same reference numerals.

Figure 1A:
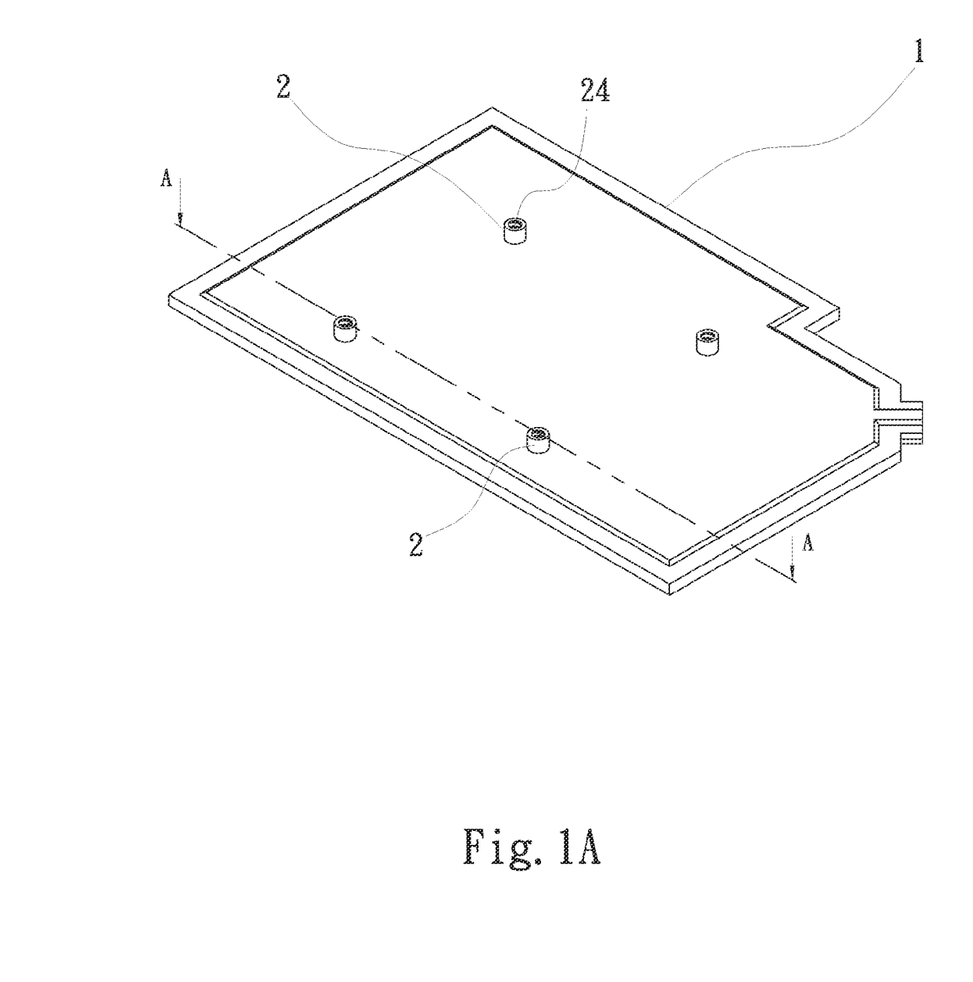
FIG. 1A is an assembled perspective view of a heat dissipation unit with mounting structure according to a first preferred embodiment of the present invention.
Figure 1B:
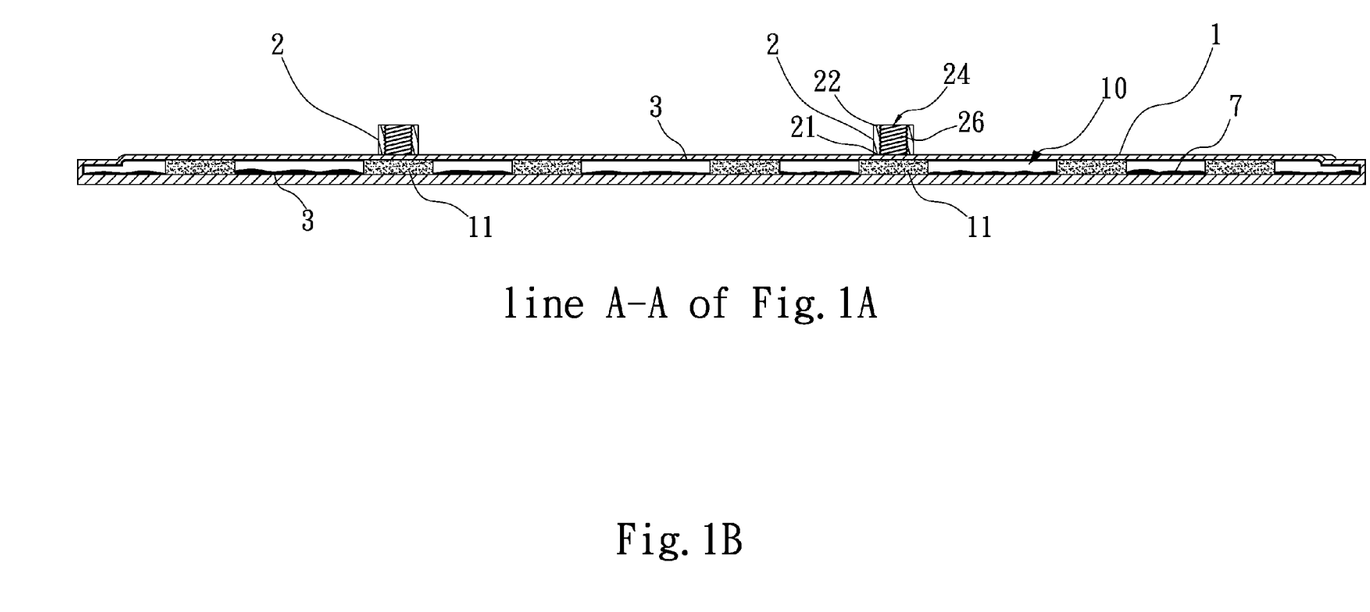
FIG. 1B is a sectional view taken along line A-A of FIG. 1A.

Please refer to FIG. 1A that is an assembled perspective view of a heat dissipation unit with mounting structure according to a first preferred embodiment of the present invention, and to FIG. 1B that is a sectional view taken along line A-A of FIG. 1A.

As shown, the heat dissipation unit with mounting structure in the first embodiment includes a main body 1 and a plurality of mounting elements 2. While the heat dissipation unit illustrated in the first embodiment is configured as a vapor chamber, it is understood the heat dissipation unit is not particularly limited to a vapor chamber but can be differently configured. For example, the heat dissipation unit can be otherwise configured as a hot plate. The main body internally defines a chamber 10, in which a plurality of supports 11 is provided. The supports 11 respectively have two opposite ends connected to two opposite inner wall surfaces of the chamber 10 for supporting the chamber 10. The supports 11 are made of a metal material and in the form of posts, such as copper posts. Further, the supports 11 can be provided on respective outer surface with a sintered structure or a plurality of grooves.

The chamber 10 is internally filled with a working fluid 7, which can be purified water, inorganic compounds, alcohols, ketones, liquid-phase metals, organic compounds, or different combinations thereof. At least one wick structure 3 is formed on the inner wall surfaces of the chamber 10. When the working fluid 7 in a vapor phase condenses into liquid again at a second side, i.e. a condensing side, of the main body 1, the wick structure 3 helps the liquid-phase working fluid 7 to flow back to a first side, i.e. a vaporizing side, of the main body 1, enabling liquid-vapor circulation of the working fluid 7 in the chamber 10 to continuously transfer heat from the vaporizing side to the condensing side.

The mounting elements 2 are made of a metal material. In the illustrated first preferred embodiment, the mounting elements 2 are made of a copper material. However, it is understood, in practical implementation of the present invention, the material for forming the mounting elements 2 is not particularly limited to copper but can include aluminum, gold, iron, aluminum alloys, or any other metal alloys.

Figure 2:
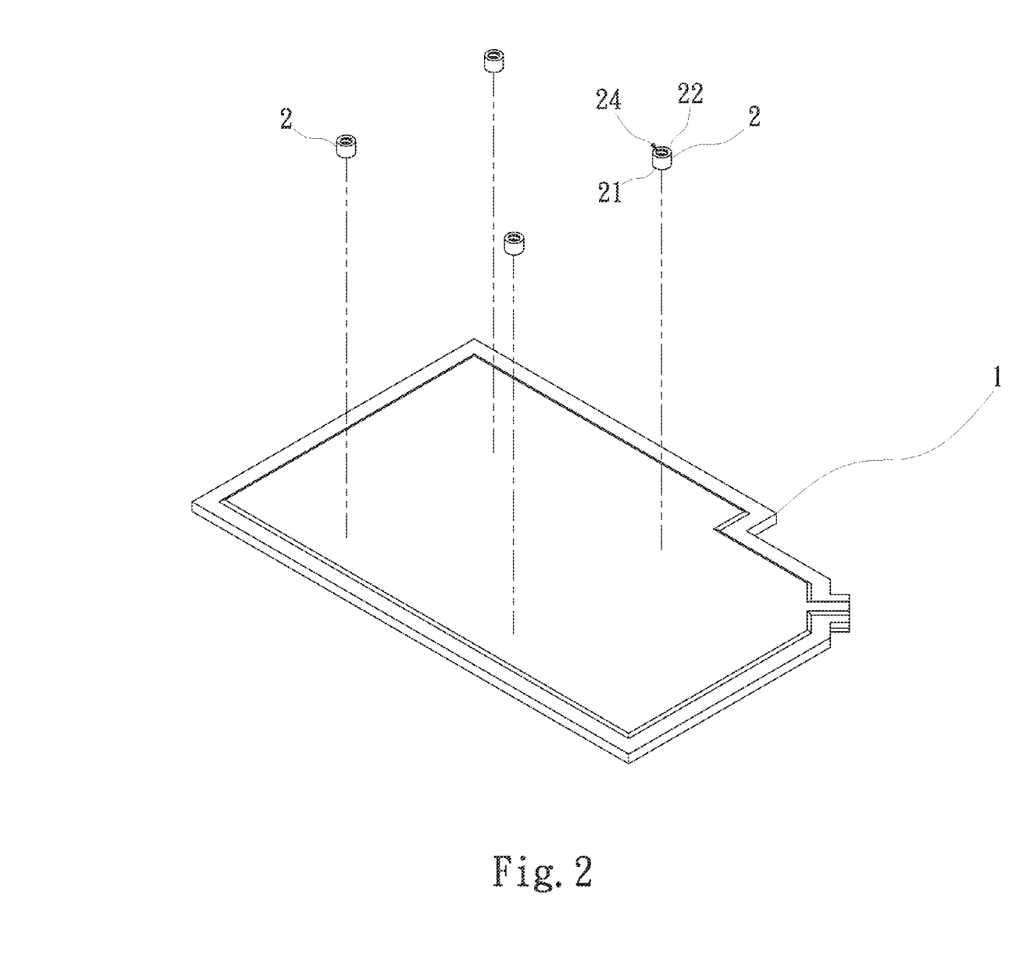
FIG. 2 is an exploded perspective view of the heat dissipation unit with mounting structure according to the first preferred embodiment of the present invention.

FIG. 2 is an exploded perspective view of the heat dissipation unit with mounting structure according to the first preferred embodiment of the present invention. Please refer to FIG. 2 along with FIG. 1B. The mounting elements 2 are externally connected to the first side of the main body 1 and are located at positions corresponding to the supports 11 in the chamber 10. The mounting elements 2 are connected to the first side of the main body 1 by way of welding, machining, or corona discharging, so as to form an integral part of the main body 1.

The mounting elements 2 respectively include a connection end 21 and an opposite free end 22, and internally define an axial coupling bore 24. The connection ends 21 are fixedly connected to the first side of the main body 1 to correspond to the supports 11 in the chamber 10. The coupling bores 24 are internally provided with screw threads 26 for engaging with corresponding fastening elements, such as the fastening elements 5 shown in FIG. 4.

By connecting the mounting elements 2 to one side (i.e. the first or vaporizing side) of the main body 1 at positions corresponding to the supports 11 in the chamber 10, it is able to effectively protect the chamber 10 against leakage. That is, with the present invention, it is able to effectively ensure the air-tightness of the chamber 10 and accordingly, the heat transfer efficiency of the heat dissipation unit. Moreover, the mounting elements 2 with the internal screw threads 26 provide enhanced locking effect for the heat dissipation unit to securely connect to other elements via the mounting elements 2.

Figure 3:
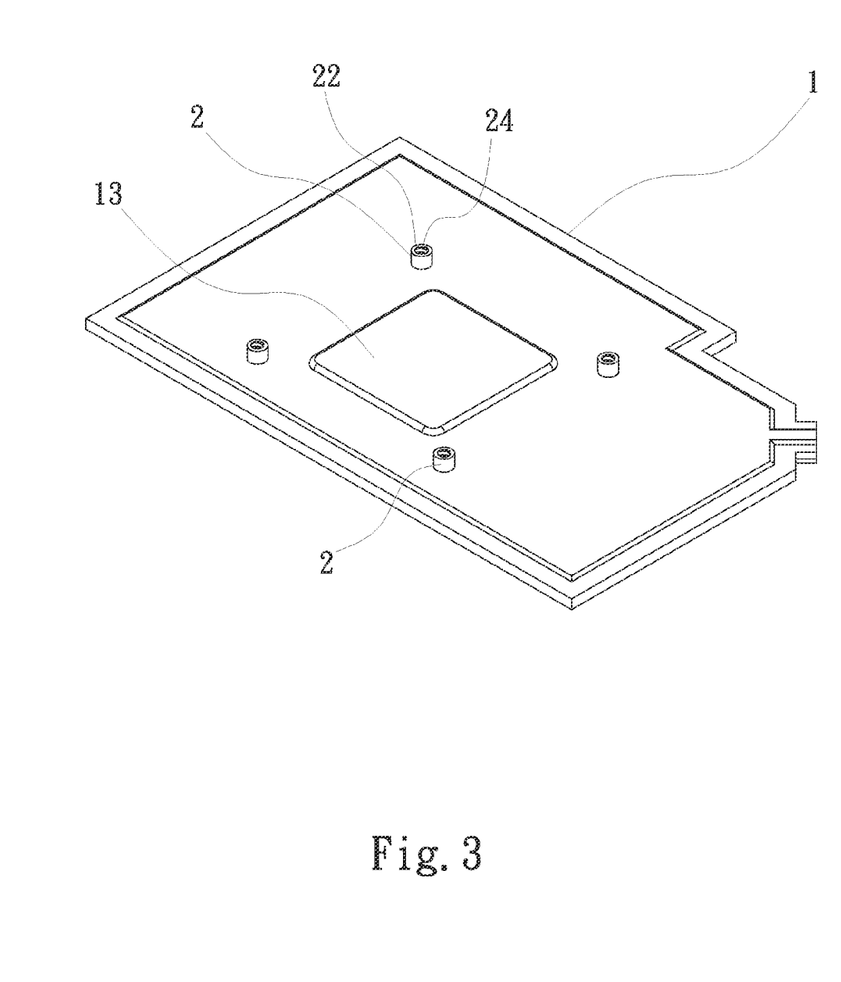
FIG. 3 is an assembled perspective view of a heat dissipation unit with mounting structure according to a second preferred embodiment of the present invention.
Figure 4:
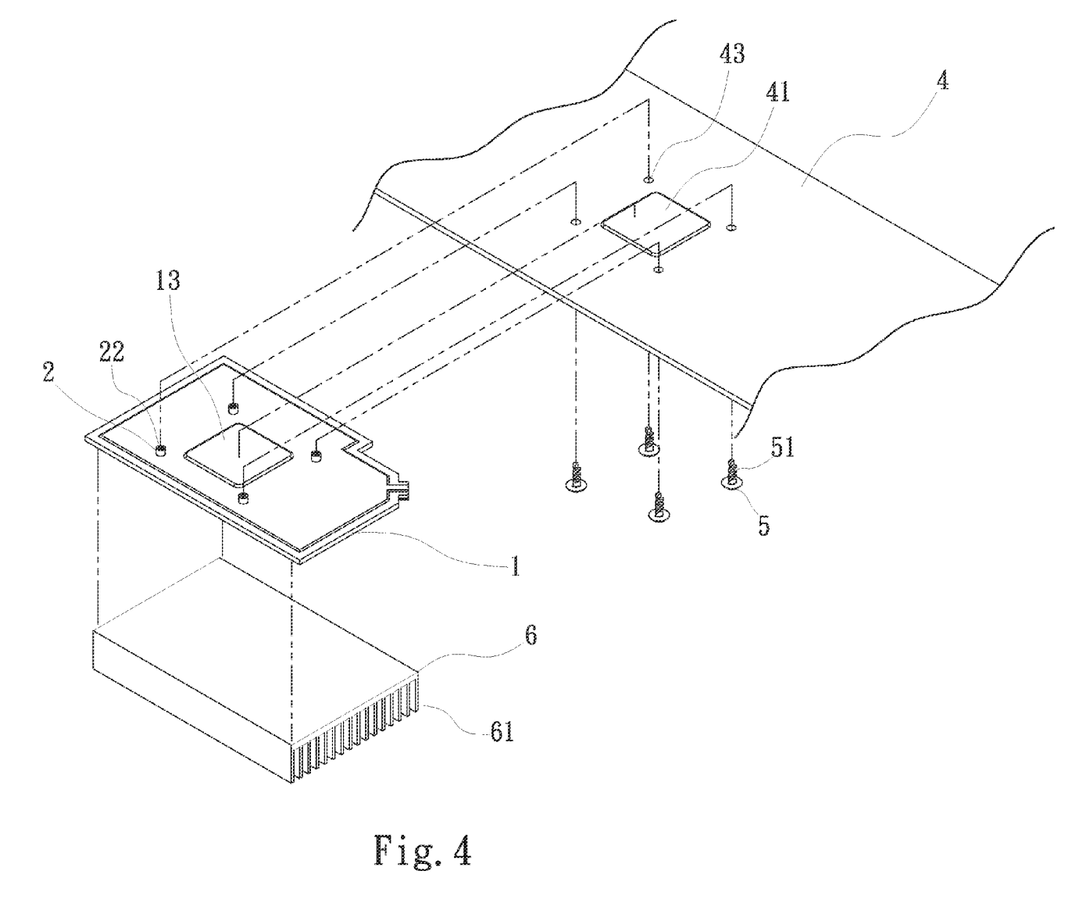
FIG. 4 is an exploded perspective view of the heat dissipation unit with mounting structure according to the second preferred embodiment of the present invention.
Figure 5:
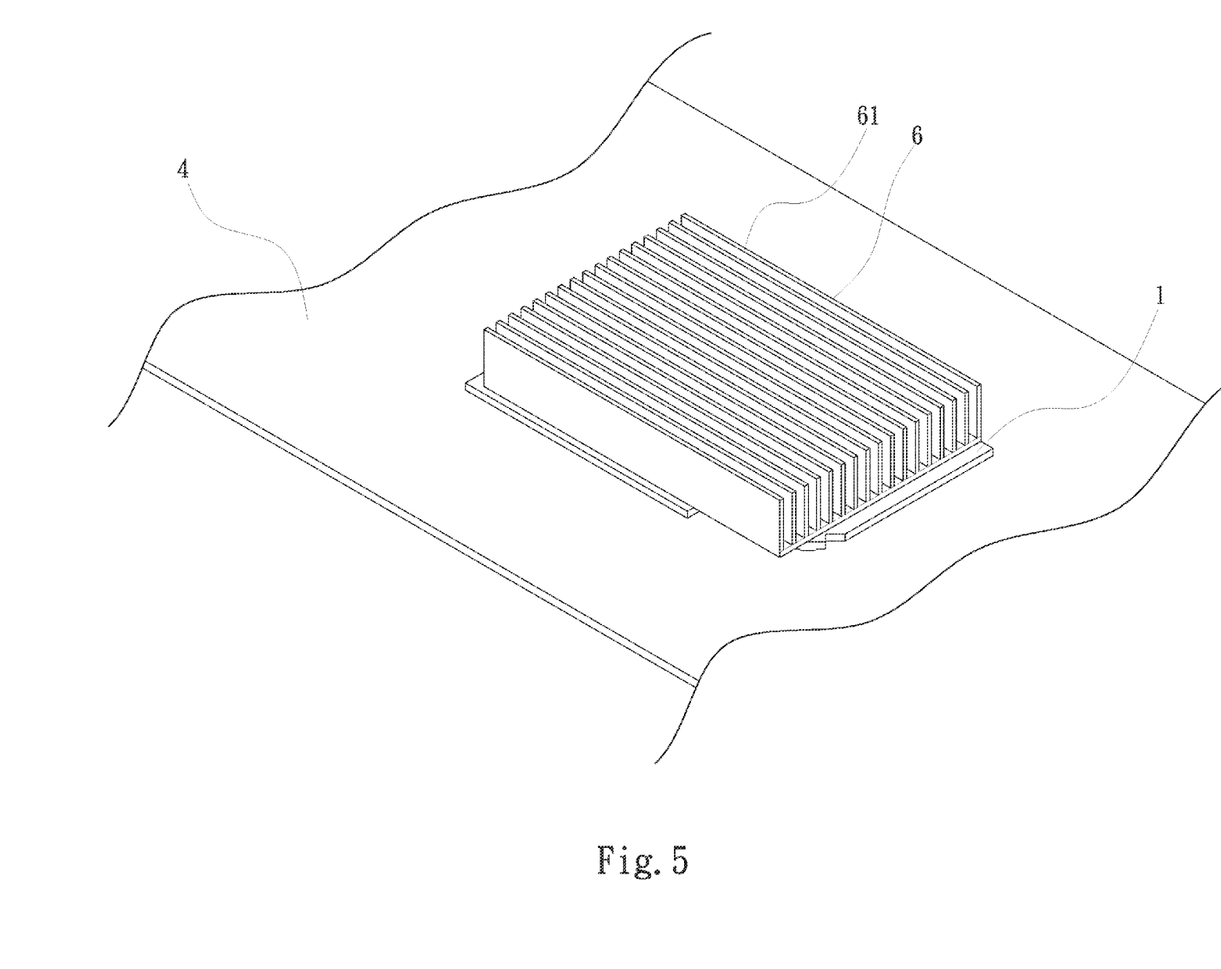
FIG. 5 is another assembled perspective view of the heat dissipation unit with mounting structure according to the second preferred embodiment of the present invention.

Please refer to FIGS. 3, 4 and 5 in which a heat dissipation unit with mounting structure according to a second preferred embodiment of the present invention is shown. The second embodiment is generally structurally and functionally similar to the first preferred embodiment, except that the main body 1 in the second embodiment further includes at least one heat absorption zone 13, which is raised from the first side of the main body 1 and located in the vicinity of the mounting elements 2; and that the main body 1 is correspondingly attached to a circuit board 4. The circuit board 4 includes at least one heat-generating element 41, such as a central processing unit, a south-bridge and north-bridge chip, or a graphic chip; and the heat absorption zone 13 is correspondingly attached to the heat-generating element 41 on the circuit board 4 for absorbing heat generated by the heat-generating element 41 during operation thereof.

The free ends 22 of the mounting elements 2 are in contact with one side of the circuit board 4 facing toward the main body 1, and a plurality of fastening elements 5 can be correspondingly extended through a plurality of mounting holes 43 on the circuit board 4 to screw into the coupling bores 24 of the mounting elements 2, so as to connect the main body 1 to the circuit board 4. The fastening elements 5 are provided with external screw threads 51, which mesh with the internal screw threads 26 of the coupling bores 24.

As can be seen from FIGS. 4 and 5, the main body 1 is provided on the second side with a heat sink 6. The heat sink 6 includes a plurality of radiating fins 61, which are connected to the second side of the main body 1, so that the heat transferred from the first side to the second side of the main body 1 is radiated from the radiating fins 61 into ambient air, bringing the vapor-phase working fluid 7 at the condensing side (i.e. the second side) of the main body 1 to condense into liquid more quickly.

With the above arrangements, the mounting elements 2 are connected to the main body 1 without causing damage to the structure of the heat dissipation unit and enable the heat absorption zone 13 to tightly contact with the heat-generating element 41 to avoid the thermal resistance. Further, since the mounting elements 2 do not extend into the main body 1, it is possible to effectively protect the main body 1 against leakage and accordingly ensure the air-tightness of the chamber 10 as well as the heat transfer efficiency of the heat dissipation unit. Moreover, the mounting elements 2 with the internal screw threads 26 can provide enhanced locking effect for the heat dissipation unit to securely connect to the circuit board 4 via the mounting elements 2.

Figure 6A:
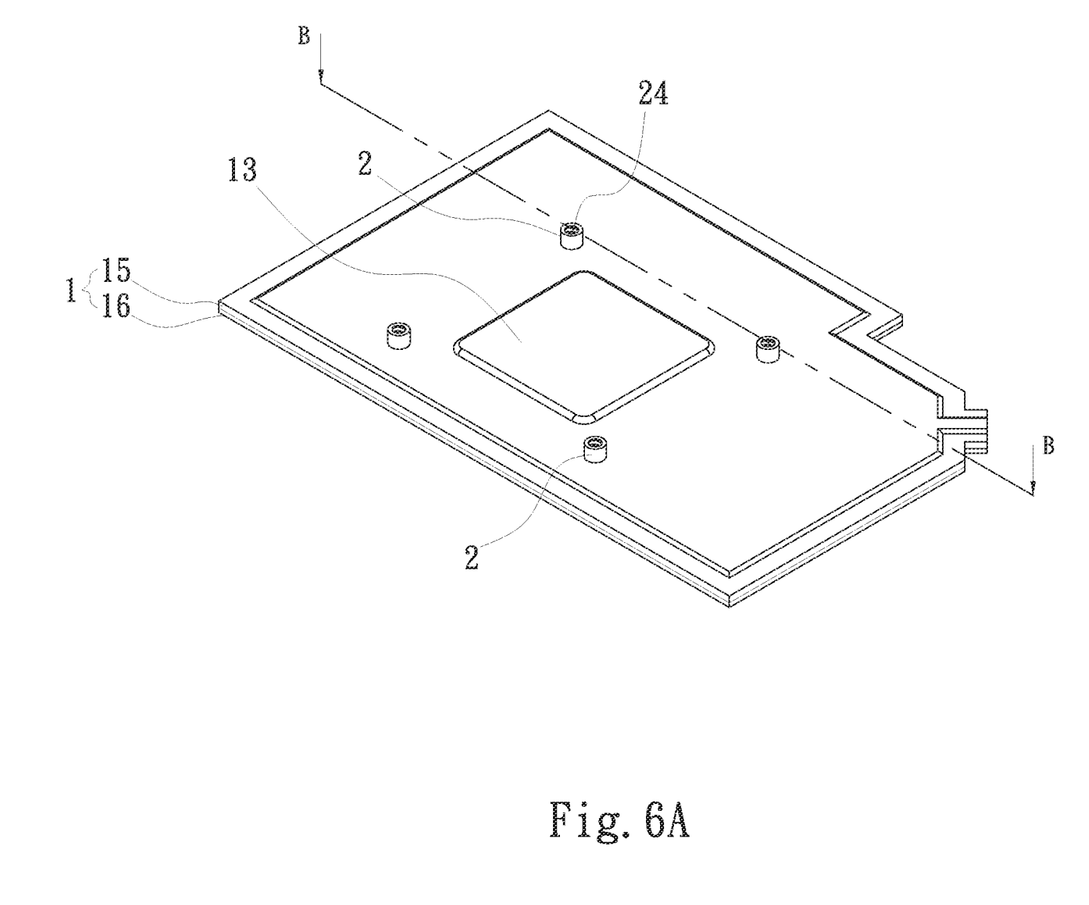
FIG. 6A is an assembled perspective view of a heat dissipation unit with mounting structure according to a third preferred embodiment of the present invention.
Figure 6B:
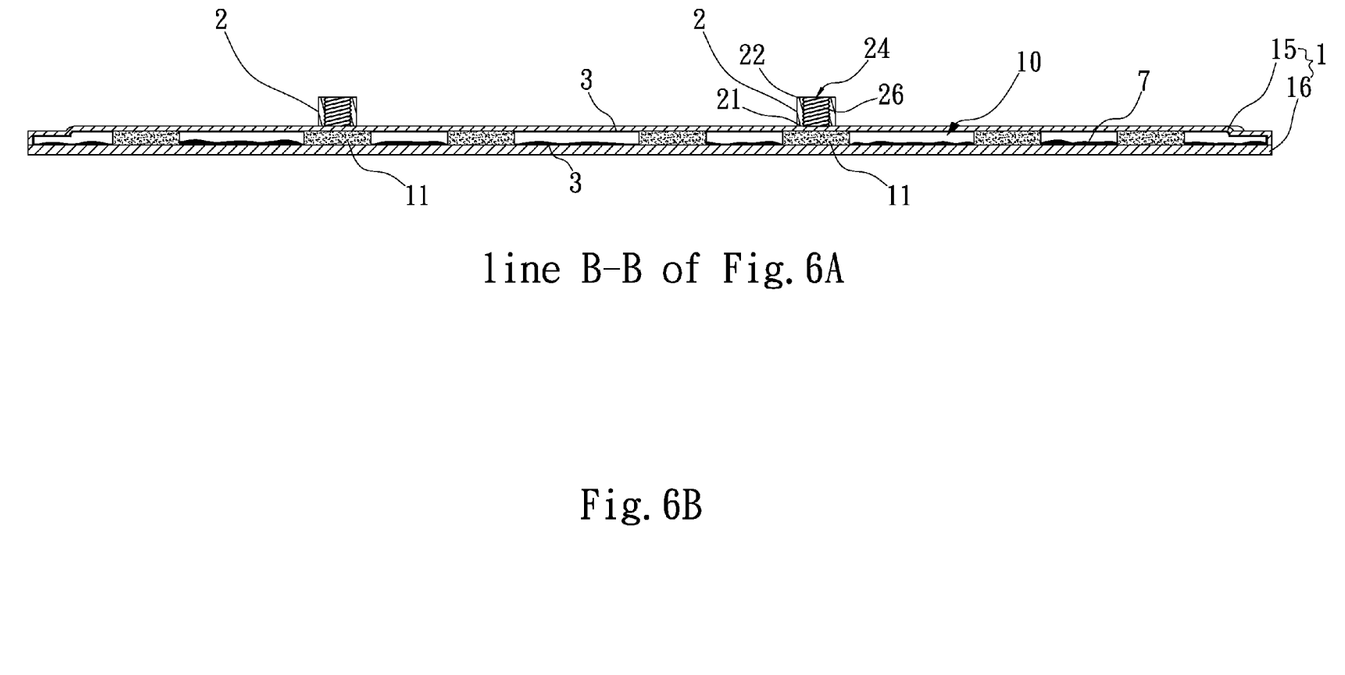
FIG. 6B is a sectional view taken along line B-B of FIG. 6A.

Please refer to FIG. 6A that is an assembled perspective view of a heat dissipation unit with mounting structure according to a third preferred embodiment of the present invention, and to FIG. 6B that is a sectional view taken along line B-B of FIG. 6A. As shown, the third embodiment is generally structurally and functionally similar to the second preferred embodiment, except that the main body 1 in the third embodiment is formed from a first plate 15 and a second plate 16 that are closed to each other to together define the chamber 10 therebetween.

In the third embodiment, the supports 11 provided in the chamber 10 are respectively connected at two opposite ends to inner sides of the first plate 15 and the second plate 16 for supporting the first and the second plate 15, 16; and the mounting elements 2 are externally connected to the first plate 15 corresponding to the supports 11 in the chamber 10 in the main body 1.

Moreover, the raised heat absorption zone 13 is provided on an outer side of the first plate 15 for contacting with the heat-generating element 41 on the circuit board 4.

By screwing the fastening elements 5 through the mounting holes 43 on the circuit board 4 into the coupling bores 24 in the mounting elements 2, the main body 1 is locked to the circuit board 4. And, the heat sink 6 is connected to an outer side of the second plate 16 to help in quick dissipation of heat.

By externally providing the mounting elements 2 on the first plate 15 at positions corresponding to the supports 11, the heat dissipation unit can be effectively protected against damage to its structure while the heat absorption zone 13 can be in tight contact with the heat-generating element 41 on the circuit board 4 to avoid the thermal resistance. That is, the chamber 10 is effectively protected against leakage to ensure the air-tightness thereof and accordingly, the heat transfer efficiency of the heat dissipation unit. Moreover, the mounting elements 2 with the internal screw threads 26 can provide enhanced locking effect for the heat dissipation unit to securely connect to the circuit board 4 via the mounting elements 2.

In brief, the present invention provides the following advantages: (1) the mounting elements are externally provided on the heat dissipation unit without damaging the main body or causing leakage of the chamber to adversely affect the heat transfer efficiency of the heat dissipation unit; and (2) the mounting elements with internal screw threads provide enhanced locking effect.

The present invention has been described with some preferred embodiments thereof and it is understood that many changes and modifications in the described embodiments can be carried out without departing from the scope and the spirit of the invention that is intended to be limited only by the appended claims.

What is claimed is:
1. A heat dissipation unit with mounting structure, comprising:

a main body internally defining a chamber, and including a plurality of discreet support elements provided and sealed in the chamber, a working fluid filled in the chamber, and at least one wick structure formed on inner wall surfaces of the chamber; and a plurality of mounting elements being externally connected to a first side of the main body at positions corresponding to the supports in the chamber and without penetrating the main body and the chamber, such that the plurality of mounting elements are separated from the supports by the first side; and each of the mounting elements internally defining an axial coupling bore, wherein the mounting elements respectively include a connection end and an opposite free end, and the mounting elements being fixedly connected at the connection ends to the first side of the main body corresponding to the supports in the chamber, wherein the main body is provided on the first side with at least one raised heat absorption zone, and the mounting elements being located in the vicinity of the raised heat absorption zone, and wherein the main body is correspondingly connected to a circuit board via the mounting elements with the heat absorption zone correspondingly contacting with at least one heat-generating element on the circuit board.

2. The heat dissipation unit with mounting structure as claimed in claim 1, wherein the main body is connected to the circuit board with the free ends of the mounting elements in contact with one side of the circuit board facing toward the main body, allowing a plurality of fastening elements to be correspondingly extended through a plurality of mounting holes formed on the circuit board into the coupling bores of the mounting elements via the free ends thereof.

3. The heat dissipation unit with mounting structure as claimed in claim 1, wherein the main body is connected at an opposite second side to a heat sink, and the heat sink including a plurality of radiating fins.

4. The heat dissipation unit with mounting structure as claimed in claim 1, wherein the main body is selected from the group consisting of a vapor chamber and a hot plate.

5. The heat dissipation unit with mounting structure as claimed in claim 2, wherein the coupling bores are respectively provided with internal screw threads and the fastening elements are respectively provided with external screw threads meshing with the internal screw threads of the coupling bores.

6. The heat dissipation unit with mounting structure as claimed in claim 1, wherein the mounting elements are made of a metal material.

7. The heat dissipation unit with mounting structure as claimed in claim 6, wherein the metal material for forming the mounting elements is selected from the group consisting of copper, aluminum, gold, iron, aluminum alloys, and any other metal alloys.

8. The heat dissipation unit with mounting structure as claimed in claim 1, wherein the mounting elements are connected to the first side of the main body in a manner selected from the group consisting of welding, machining and corona discharging.

9. The heat dissipation unit with mounting structure as claimed in claim 1, wherein the main body is formed from a first plate and a second plate that are closed to each other to together define the chamber therebetween.

* * * * *